(12) United States Patent
Dai et al.

(10) Patent No.: US 11,768,435 B2
(45) Date of Patent: Sep. 26, 2023

(54) BOTTOM-UP CONFORMAL COATING AND PHOTOPATTERNING ON PAG-IMMOBILIZED SURFACES

(71) Applicant: Brewer Science, Inc., Rolla, MO (US)

(72) Inventors: Jinhua Dai, Rolla, MO (US); Joyce A. Lowes, Rosebud, MO (US); Carissa Jones, Springfield, MO (US)

(73) Assignee: Brewer Science, Inc., Rolla, MO (US)

( * ) Notice: Subject to any disclaimer, the term of this patent is extended or adjusted under 35 U.S.C. 154(b) by 590 days.

(21) Appl. No.: 16/671,426

(22) Filed: Nov. 1, 2019

(65) Prior Publication Data

US 2020/0142308 A1 May 7, 2020

Related U.S. Application Data

(60) Provisional application No. 62/754,837, filed on Nov. 2, 2018.

(51) Int. Cl.
*G03F 7/004* (2006.01)
*G03F 7/095* (2006.01)
(Continued)

(52) U.S. Cl.
CPC .......... *G03F 7/0955* (2013.01); *C08F 212/08* (2013.01); *C08F 220/281* (2020.02);
(Continued)

(58) Field of Classification Search
CPC . G03F 7/004; G03F 7/11; G03F 7/165; G03F 7/168; G03F 7/0955
See application file for complete search history.

(56) References Cited

U.S. PATENT DOCUMENTS 6,114,082 A 9/2000 Hakey et al.
7,049,044 B2 * 5/2006 Gonsalves ............ G03F 7/0758
430/905
(Continued)

FOREIGN PATENT DOCUMENTS

JP 2013-140319 7/2013
JP 2013-151592 8/2013
(Continued)

OTHER PUBLICATIONS

Wang et al., "Novel polymeric anionic photoacid generators (PAGs) and corresponding polymers for 193 nm lithography," Journal of Materials Chemistry, 2006, 16, 3701-3707.
(Continued)

*Primary Examiner* — Amanda C. Walke
(74) *Attorney, Agent, or Firm* — HOVEY WILLIAMS LLP

(57) ABSTRACT

Materials and methods to immobilize photoacid generators on semiconducting substrates are provided. PAG-containing monomers are copolymerized with monomers to allow the polymer to bind to a surface, and optionally copolymerized with monomers to enhance solubility to generate PAG-containing polymers. The PAG-containing monomers can be coated onto a surface, where the immobilized PAGs can then be used to pattern materials coated on top of the immobilized PAGs, allowing direct patterning without the use of a photoresist, thereby reducing process steps and cost. The disclosed materials and processes can be used to produce conformal coatings of controlled thicknesses.

39 Claims, 6 Drawing Sheets

(51) Int. Cl.
  *C08F 212/08* (2006.01)
  *C08F 220/28* (2006.01)
  *G03F 7/34* (2006.01)
  *G03F 7/16* (2006.01)
  *C08F 220/38* (2006.01)

(52) U.S. Cl.
  CPC ........ *C08F 220/382* (2020.02); *G03F 7/0045* (2013.01); *G03F 7/165* (2013.01); *G03F 7/168* (2013.01); *G03F 7/34* (2013.01)

(56) References Cited

U.S. PATENT DOCUMENTS

| | | | | |
|---|---|---|---|---|
| 7,569,326 | B2* | 8/2009 | Ohsawa | C08F 20/38 562/113 |
| 8,039,198 | B2* | 10/2011 | Tachibana | G03F 7/0045 430/326 |
| 8,048,610 | B2* | 11/2011 | Ohsawa | G03F 7/0397 430/326 |
| 8,119,324 | B2* | 2/2012 | Sugita | G03F 7/0045 430/394 |
| 8,383,318 | B2* | 2/2013 | Meador | G03F 7/091 430/913 |
| 8,394,570 | B2 | 3/2013 | Ohashi et al. | |
| 8,507,176 | B2 | 8/2013 | Thackeray et al. | |
| 8,632,939 | B2* | 1/2014 | Masunaga | G03F 7/0046 430/326 |
| 8,900,792 | B2 | 12/2014 | Thackeray et al. | |
| 9,223,209 | B2 | 12/2015 | Sanders et al. | |
| 9,422,445 | B2 | 8/2016 | Sanders et al. | |
| 9,523,917 | B2* | 12/2016 | Ban | G03F 7/32 |
| 9,640,396 | B2 | 5/2017 | Lin et al. | |
| 9,733,566 | B2* | 8/2017 | Smith | G03F 7/26 |
| 9,772,555 | B2* | 9/2017 | Park | H01L 21/0276 |
| 9,960,038 | B2 | 5/2018 | Washburn et al. | |
| 10,429,737 | B2* | 10/2019 | Lee | C07D 213/75 |
| 2006/0147835 | A1 | 7/2006 | Lee et al. | |
| 2009/0297979 | A1 | 12/2009 | Hatakeyama et al. | |
| 2013/0084529 | A1 | 4/2013 | Hatakeyama et al. | |
| 2013/0143163 | A1 | 6/2013 | Hatakeyama | |
| 2013/0189620 | A1 | 7/2013 | Suka et al. | |
| 2020/0233307 | A1* | 7/2020 | Dai | G03F 7/0752 |

FOREIGN PATENT DOCUMENTS

| KR | 10-2006-0079638 | 7/2006 |
|---|---|---|
| WO | 2010/096615 | 8/2010 |

OTHER PUBLICATIONS

International Search Report and Written Opinion dated Feb. 25, 2020 in corresponding PCT/US2019/059481 filed Nov. 1, 2019, 11 pages.
Office Action dated Apr. 11, 2023 in corresponding Japanese Patent Application No. 2021-523462, 4 pages.
Translation of Office Action dated Apr. 11, 2023 in corresponding Japanese Patent Application No. 2021-523462, 7 pages.

* cited by examiner

BOTTOM-UP CONFORMAL COATING AND PHOTOPATTERNING ON PAG-IMMOBILIZED SURFACES

RELATED APPLICATIONS

The present application claims the priority benefit of U.S. Provisional Patent Application Ser. No. 62/754,837, filed Nov. 2, 2018, entitled BOTTOM-UP CONFORMAL COATING AND PHOTOPATTERNING ON PAG-IMMOBILIZED SURFACES, incorporated by reference in its entirety herein.

BACKGROUND

Field of the Invention

The present invention relates broadly to compositions and methods of using those compositions in forming microelectronic structures.

Description of Related Art

Photo acid generators ("PAGs") are key materials in modern photolithography. In a typical photoresist, polymer resins are blended with a PAG and solvent. When activated by irradiation, the PAG releases a strong acid, which catalyzes chemical reactions to alter the solubility of the exposed area. In older technology nodes, such as DUV photolithography, this method was effective. However, as the feature size reduces, the drawbacks of anisotropic acid diffusion, such as broadened feature size and line edge roughness, become progressively evident. To overcome these drawbacks, researchers have developed new photoresists to attempt to improve feature fidelity, as evidenced by line edge roughness (LER) reduction, however, further improvements are needed.

SUMMARY

In one embodiment, the invention is broadly concerned with a method of forming a structure. The method comprises applying an acid-generating composition on a substrate surface, or on one or more intermediate layers optionally present on the substrate surface. The acid-generating composition comprises a polymer including recurring monomers comprising an acid-generating group. The acid-generating composition is heated to form an acid-generating layer. An acid-sensitive composition is applied on the acid-generating layer, with the acid-sensitive composition comprising less than about 0.5% by weight total of acids, photoacid generators, and thermal acid generators, based upon the total weight of the composition taken as 100% by weight. The acid-sensitive composition is heated to form an acid-sensitive layer, and at least a portion of the acid-sensitive layer is exposed to radiation.

In another embodiment, the invention is directed towards a microelectronic structure comprising:
 a substrate having a surface;
 one or more optional intermediate layers on the substrate surface;
  an acid-generating layer on the one or more optional intermediate layers, if present, or on the substrate surface, if no intermediate layers are present, the acid-generating layer comprising a polymer including recurring monomers comprising an acid-generating group; and
  an acid-sensitive layer on the acid-generating layer, the acid-sensitive layer comprising less than about 0.5% by weight total of acids, photoacid generators, and thermal acid generators, based upon the total weight of the acid-sensitive layer taken as 100% by weight.

In a further embodiment, the invention involves, a microelectronic structure comprising: a substrate having a surface;
 one or more optional intermediate layers on the substrate surface;
 an acid-generating layer on the one or more optional intermediate layers, if present, or on the substrate surface, if no intermediate layers are present, the acid-generating layer comprising:
  unexposed portions that comprise a first polymer including recurring monomers comprising an acid-generating group; and
  exposed portions that comprise a second polymer and an acid; and an acid-sensitive layer on the acid-generating layer, the acid-sensitive layer comprising:
 unexposed portions that comprise less than about 0.5% by weight total of acids, photoacid generators, and thermal acid generators, based upon the total weight of the unexposed portions taken as 100% by weight, and that have a first solubility in a photoresist developer and/or a photoresist solvent; and
 exposed portions that have a second solubility in the same photoresist developer (e.g., aqueous TMAH) and/or photoresist solvent (e.g., n-butyl acetate, PGMEA, isopropanol, and/or PGME), the second solubility being different than the first solubility of the unexposed portions.

In yet a further embodiment, the invention provides a composition comprising a polymer dissolved or dispersed in a solvent system. The polymer comprises:
 recurring monomers comprising an acid-generating group; and
 recurring monomers comprising a surface adhesion group selected from the group consisting of hydroxys, epoxies, carboxylic acids, thiols, silanes, aldehydes, acetylacetonates, and combinations of the foregoing, wherein the composition comprises a total solids content, and the polymer is 99.5% to 100% of the total solids content.

DETAILED DESCRIPTION

Figure 1A:
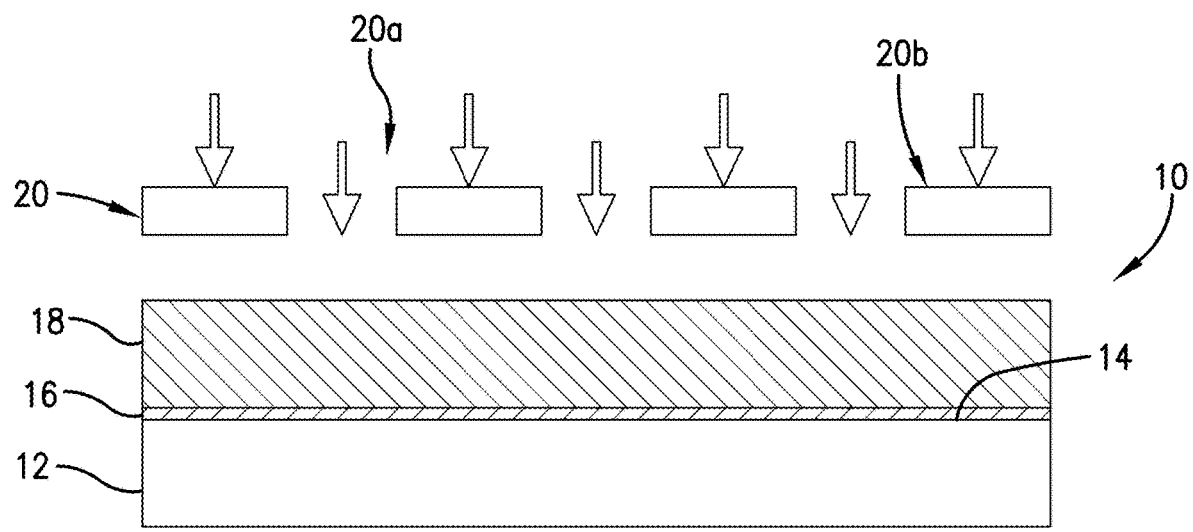
FIG. 1(A) is a schematic depiction of one method of using the disclosed PAG-immobilization layers.

The present invention is broadly concerned with novel compositions comprising a PAG-containing polymer and methods of using those compositions.

Compositions

1. Compositions for PAG Immobilization Layer

Preferred compositions for use in the photoacid generator ("PAG") immobilization layer (also referred to herein as an "acid-generating layer") comprise a polymer dispersed or dissolved in a solvent system. Preferred polymers for inclusion in the PAG immobilization compositions comprise recurring monomers that include PAG-containing monomers and surface adhesion monomers. In some embodiments, the PAG immobilization layer is adhered (and may be strongly adhered) to the substrate, an intermediate layer, and/or an area of infinity (as explained below), but "immobilization" or "immobilized" is not intended to limit to that type of attachment unless expressly stated.

Suitable PAG-containing monomers comprise a functional group that generates an acid upon exposure to light at the target wavelength(s) (i.e., the monomer comprises a PAG as part of its structure). Examples of such functional groups are moieties of those selected from the group consisting of onium salts (e.g., triphenyl sulfonium ("TPS") perfluorosulfonates such as TPS nonaflate, TPS triflate); substituted forms of onium salts (e.g., alkyl-substituted TPS nonaflate (preferably $C_1$-$C_8$-substituted); tris(4-tert-butylphenyl)sulfonium perfluoro-1-butanesulfonate); oxime-sulfonates (e.g., Irgacure PAG 203, CGI PAG 19XX, N-hydroxynaphthalimide triflate, N-hydroxy-5-norbornene-2,3-dicarboximide perfluoro-1-butanesulfonate); triazines (e.g., 2-methyl-2-(2'-furylethylidene)-4,6-bis(trichloromethyl)-1,3,5-triazine, 2-[(4'-methoxy)styryl]-4,6-bis(trichloromethyl)-1,3,5-triazine); and combinations thereof.

The foregoing functional groups can be substituted onto, or bonded with, typical compounds used as monomers in microelectronic chemicals. These include those selected from the group consisting of acrylates (e.g., acrylic acid, methacrylates), acrylamides, acrylonitriles, esters, amides, aromatic amines and diamines, dianhydrides, and combinations thereof.

Especially preferred PAG-containing monomers include, but are not limited to, triphenylsulfonium 3-sulfopropyl methacrylate ("TPS-SPMA," the middle monomer of Polymer A below) and triphenylsulfonium 4-(methacryloxy)-2,3,5,6-tetrafluoro benzenesulfonate ("TPS-4FBSMA," the middle monomer of Polymer B below).

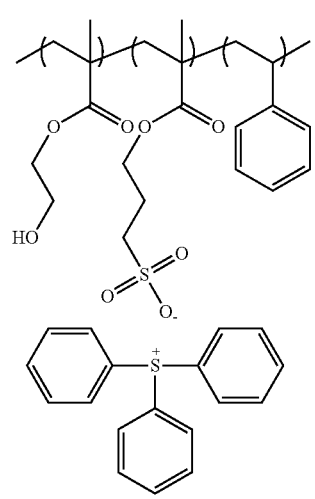

A

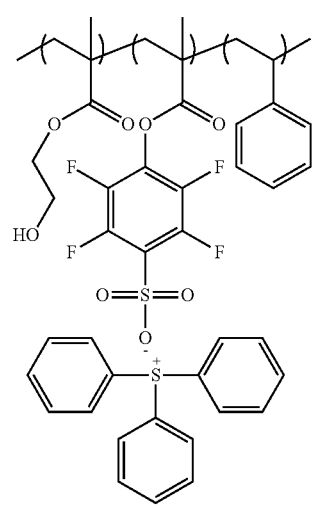

B

The PAG-containing monomers can be prepared according to U.S. Pat. No. 8,900,792, incorporated by reference herein.

The PAG-containing monomer is generally present in the polymer at a level of from about 1% to about 99% by mass, preferably from about 10% to about 99% by mass, more preferably from about 15% to about 70% by mass, and even more preferably from about 20% to about 50% by mass, based on the total mass of the polymer taken as 100%. As used herein, "by mass, based on the total mass of the polymer taken as 100%" refers to the mass of each monomer added to the polymerization reaction as a function of the mass of all of the monomers included in the polymerization reaction as a whole, and may not be an exact representation of the mass of the repeat unit in the polymer as a whole after the polymerization reaction.

Suitable surface adhesion monomers for use in the polymers of the PAG immobilization composition are preferably selected to enhance surface bonding between the layer formed from the PAG immobilization composition and the substrate or other layer on which the PAG immobilization layer is formed. The surface adhesion monomers will have functional groups able to chemically or physically interact with the substrate surface, and it will be appreciated that different surface adhesion monomers may be used for different surfaces.

Additionally, it is preferred that the surface adhesion monomers are not acid-sensitive. As used herein, "acid-sensitive," means that groups, monomers, or polymer (as the case may be) will undergo a chemical change upon exposure to an acid. For example, a crosslinking or decrosslinking reaction may be initiated upon exposure to an acid. As another example, a deprotecting reaction might be initiated upon exposure to an acid. A group, monomer, polymer, etc., that is not acid-sensitive will not experience chemical changes as a result of exposure to an acid.

Preferred surface adhesion monomers include those functional groups or moieties selected from the group consisting of hydroxys (such as 2-hydroxyethyl methacrylate and/or hydroxypropyl methacrylate); epoxies (such as glycidyl methacrylate); carboxylic acids (such as methacrylic acid, acrylic acid, and/or mono-2-(methacryloyloxy)ethyl succinate); thiols (such as 2-(methylthio)ethyl methacrylate); silanes (such as 3-(trimethoxysilyl)propyl methacrylate); aldehydes (such as 3-[(4-ethenylphenyl)methoxy]-benzaldehyde); acetylacetonates (such as 2-(methacryloyloxy)ethyl acetoacetate); and combinations of one or more of the foregoing.

The surface adhesion monomer is preferably present in the polymer at a level of from about 1% to about 25% by mass, more preferably from about 5% to about 20% by mass, and even more preferably from about 5% to about 15% by mass, based on the total mass of the polymer taken as 100%.

In one embodiment, the polymers can further comprise a solubility-enhancing monomer, which can be useful if the chosen PAG-containing monomer included in the polymer is not readily dissolvable in the chosen solvent (e.g., propylene glycol methyl ether ("PGME"), propylene glycol methyl ether acetate ("PGMEA"), cyclohexanone). Preferred solubility-enhancing monomers include styrene, methyl methacrylate, methylstyrene, 4-tert-butylstyrene, n-butyl methacrylate, benzyl methacrylate, and combinations thereof. When utilized, the solubility-enhancing monomer is preferably present in the polymer at a level of from about 1% to about 60% by mass of the polymer, preferably from about 15% to about 50% by mass of the polymer, and more preferably from about 25% to 50%, based on the total mass of the polymer taken as 100%.

Although the polymer can include other monomers in addition to PAG-containing monomers and surface adhesion monomers, in one embodiment, the polymer consists essentially of, or even consists of, only the PAG-containing monomer(s) and surface adhesion monomer(s). In another embodiment, the polymer consists essentially of, or even consists of, only the PAG-containing monomer(s), surface adhesion monomer(s) and solubility-enhancing monomer(s).

The polymer containing the foregoing monomers can be synthesized by any suitable polymerization method, with one preferred polymerization method being free radical polymerization. In one preferred embodiment, the polymer is synthesized via free radical polymerization in a solvent such as PGME using azobisisobutyronitrile (AIBN) as an initiator. The reaction is preferably performed using an initiator in an amount of from about 1% to about 5% by mass, more preferably about 2% by mass of the monomers and allowing the polymerization to proceed at 65° C. for 16 hours.

Two preferred PAG-containing polymers include: (i) a polymer comprising recurring monomers of hydroxyethyl-methacrylate ("HEMA"), styrene, and TPS-SPMA (Polymer A above); and (ii) a polymer comprising recurring monomers of HEMA, styrene, and TPS-4FBSMA (Polymer B above). With either (i) or (ii), the polymer preferably comprises from about 1% to about 20% by mass of the HEMA monomer (and more preferably from about 5% to 10% by mass); from about 1% to 90% by mass of the styrene monomer (and more preferably from about 40% to about 60%); and from about 5% to about 95% by mass of the PAG-containing monomer (TPS-SPMA and/or TPS-4FB-SMA; more preferably from about 40% to about 60% by mass), all based on the total mass of the polymer taken as 100%.

The weight-average molecular weight (Mw) range (as measured by gel permeation chromatography) of the polymer is preferably from about is 3,000 g/mol to about 150,000 g/mol, and more preferably from about 6,000 g/mol to about 30,000 g/mol. The PAG-containing polymer will preferably be present in the composition at from about 0.5% to about 5% by weight, and more preferably from about 1% to about 2% by weight based upon the total weight of the composition taken as 100% by weight.

The PAG immobilization composition are formed by simply mixing the above polymer in a solvent system under ambient conditions. Any optional ingredients (e.g., surfactants, crosslinkers, catalysts, and/or additives) would be mixed at the same time. Additionally, although the PAG-containing compositions include a PAG attached to the polymer, the PAG-containing compositions are not photoresists in the traditional sense. Preferably, very little to no additional polymers are included in the PAG immobilization composition other than the PAG-containing polymer. That is, the PAG immobilization composition will comprise less than about 0.2% by weight other polymer, preferably less than about 0.1% by weight other polymer, and preferably about 0% by weight other polymer, based on the total solids in the composition taken as 100% by weight. For example, in one embodiment, the PAG immobilization composition consists essentially of, or even consists of, the polymer and the solvent(s) present in the solvent system.

Preferred solvent systems include a solvent selected from the group consisting of PGMEA, PGME, propylene glycol n-propyl ether ("PnP"), ethyl lactate ("EL"), cyclohexanone, gamma-butyrolactone ("GBL"), methyl isobutyl carbinol, propylene glycol ethyl ether ("PGEE"), and mixtures thereof. Preferably, the solvent system has a boiling point of from about 70° C. to about 200° C., and more preferably from about 100° C. to about 150° C. The solvent system is preferably utilized at a level of from about 95% to about 99.5% by weight, and more preferably from about 98% to about 99% by weight, based upon the total weight of the composition taken as 100% by weight, with the balance of the foregoing being attributable to the solids in the composition, which will generally be entirely the polymer discussed above. In the latter instance, the polymer will be present in the composition at a level of from about 0.5% to about 5% by weight, and preferably from about 1% to about 2% by weight, based upon the total weight of the composition taken as 100% by weight. In another embodiment, the composition has a total solids content, and the polymer is at least from about 99.5% to about 100% of that total solids content, and even more preferably about 100% of the total solids content.

Regardless of the embodiment, it will be appreciated that the PAG immobilization compositions will be selected to be compatible with the acid-sensitive topcoat and exposure wavelength being used.

2. Compositions for Topcoat Layer

The topcoat composition is formulated so that layers formed by the composition are acid-sensitive and do not strongly absorb at the wavelength used to expose the PAG immobilization layer (discussed in more detail below). The topcoat compositions form layers that can be crosslinkable (i.e., to form negative tone layers) or deprotectable/decrosslinkable (i.e., to form positive tone layers) with acid catalysis, depending upon the user's preference.

Compositions for use as the topcoat layer comprise a polymer dissolved or dispersed in a solvent system. Suitable polymers for use in the topcoat composition are acid-sensitive polymers and comprise those commonly used to form photoresist or photoimageable layers. Three exemplary patterning polymer structures are shown below.

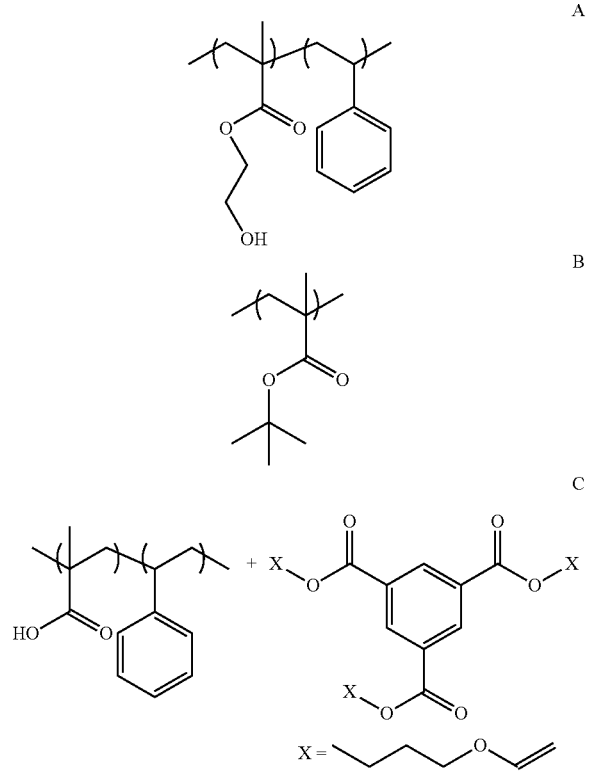

Structure A is an example of an acid-sensitive polymer for use in the topcoat composition in negative tone patterning embodiments. Acid from exposed PAGs catalyzes transesterification among adjacent HEMA components, resulting in crosslinking that renders the topcoat composition insoluble in standard photoresist solvents. Thus, the areas exposed to light become insoluble in photoresist solvents such as n-butyl acetate, PGMEA, isopropanol, and/or PGME. In this context, "insoluble" means that the layer would meet the % stripping ranges upon being subjected to the stripping test defined below but using one of the foregoing photoresist solvents.

The alcohol functional group on the first monomer of the polymer can be replaced with an epoxy, phenol, carboxylic acid, and/or or amine functional group, and the styrene on the other monomer of the polymer can be omitted or replaced with other monomers to tailor physical properties such as solubility and optical constants. In other words, the polymer used can comprise recurring monomers having functional groups selected from the group consisting of hydroxy, epoxy, phenol, carboxylic acid, and/or or amine functional groups, with or without recurring monomers comprising styrene groups. Separate crosslinkers may be added to the topcoat composition containing this polymer, as long as satisfactory contrast between the exposed and unexposed areas can be reached.

Structure B is a representative deprotectable polymer for use in the topcoat composition used in positive tone photopatterning. In this embodiment, the acid from exposed PAGs catalyzes the deprotection (in this instance, the tert-butyloxycarbonyl ("t-BOC") protecting group is removed), resulting in a solubility (usually dramatic) change between the exposed and unexposed areas. That is, the areas exposed to light become soluble in a photoresist developer, such as aqueous tetramethylammonium hydroxide (TMAH). In this embodiment, the polymer can include recurring protected monomers of carboxylic acids, and/or phenols. In this context, "soluble" means that the layer, upon being subjected to the stripping test defined below but using photoresist developers (e.g., TMAH) rather than the stripping test's organic solvents, would have a % stripping of at least about 95%, preferably at least about 99%, and preferably at least about 100%.

Structure C is a representative decrosslinkable polymer for use in the topcoat composition with positive tone photopatterning. In this embodiment, the carboxylic acid group in the polymer (structure on left) reacts with the vinyl ether group in the crosslinker (structure on right). Crosslinking proceeds via hemiacetal ester formation during baking that takes place during coating formation. Decrosslinking is catalyzed by acid generated by the exposed PAGs during a post-exposure bake process, thus making the exposed areas soluble (as defined with Structure B above) in a photoresist developer.

Regardless of the embodiment, the polymer will generally be present in the topcoat composition at from about 0.1% to about 20% by weight, preferably from about 0.5% to about 10% by weight, and more preferably from about 1% to about 5% by weight, based upon the total weight of the composition taken as 100% by weight.

The solvent system utilized in the topcoat composition is preferably selected from the group consisting of PGMEA, PGME, cyclohexanone, isopropanol, n-butyl acetate, and mixtures thereof. The solvent system is preferably utilized at a level of from about 80% to about 99.9% by weight, and more preferably from about 95% to about 99% by weight, based upon the total weight of the composition taken as 100% by weight, with the balance of the foregoing being attributable to the solids in the composition.

Other optional ingredients can be included in the topcoat composition, including crosslinkers, surfactants, and/or chromophores. In embodiments where a crosslinker is utilized, it is generally present at levels of from about 1% to about 15% by weight, and more preferably from about 5% to about 10% by weight, based upon the total weight of the polymer taken as 100% by weight, Importantly, the topcoat compositions are preferably substantially free of acids, photoacid generators, and thermal acid generators. That is, the topcoat compositions comprise less than about 0.5% by weight total of acids, photoacid generators, and thermal acid generators, preferably less than about 0.1% by weight total, and more preferably about 0% by weight total, based on the total weight of the topcoat compositions taken as 100% by weight.

The topcoat compositions are formed by simply mixing the above polymer in a solvent system under ambient conditions. Any optional ingredients would be mixed at the same time.

The foregoing describes the general guidelines for selecting and formulating compositions for use as the topcoat layer. Conceptually, the topcoat layer can be thought of as a typical photoresist layer but without an acid or source of acid. However, it will be appreciated that the topcoat layer as described herein has additional advantages in that it can be formulated to be a carbon-rich layer (e.g., a spin-on carbon layer) or hardmask layer, thus eliminating the need for additional layer applications.

As used herein, carbon-rich refers to layers formed from compositions comprising from about 50% to about 99% by weight carbon, preferably from about 70% to about 90% by weight carbon, and more preferably from about 75% to about 80% by weight carbon, based upon the total solids in the composition taken as 100% by weight. Exemplary carbon-rich layers will still be formed as described above and have those same properties (including acid-sensitive and free of acid and any acid generators), but the polymer will be selected so as to achieve the above carbon levels. Carbon-rich layers can also include one or more of the following optional ingredients: acid and/or base quenchers, catalysts, crosslinking agents, and surface modification additives.

In embodiments where the topcoat composition is formulated so that it will also function as a hardmask layer, the compositions will still be formulated as described above and have those same properties (including being acid-sensitive and free of acid and any acid generators), but will also be formulated to result in layers having a high etch bias relative to underlying layers. The hardmask layer should have an etch rate preferably at least 1 times slower than the substrate or any intermediate layers, more preferably at least 5 times slower than the substrate or any intermediate layers in an oxygen-rich plasma etch atmosphere This is typically accomplished by formulating the composition to have a high silicon content, preferably from about 10% to about 50% by weight silicon, preferably from about 30% to about 40% by weight silicon, based upon the total solids in the composition taken as 100% by weight. These levels can be achieved by using materials selected from the group consisting of silanes, siloxanes, silsesquioxanes, and mixtures of the foregoing. These groups can be incorporated to be part of the previously-discussed polymer by using silanes, siloxanes, and/or silsesquioxanes in polymerized form (i.e., creating a silicon-oxygen polymer backbone), and/or these groups could be pendant on a polymer backbone. Hardmask layers can also include one or more of the following optional ingredients: acid and/or base quenchers, catalysts, crosslinking agents, and surface modification additives.

Methods of Utilizing PAG Immobilization Compositions

In more detail, the present invention broadly provides new methods of forming a microelectronic structure. Referring to FIG. 1(A), a stack 10 is provided. Stack 10 comprises a substrate 12 having a surface 14. While any microelectronic substrate can be utilized, substrate 12 is preferably a semiconductor substrate, such as silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing. Optional intermediate layers, such as copper or aluminum oxide (not shown), may be formed on the substrate 12 prior to processing. The substrate can have a planar surface, as shown, or it can include topographic features, such as via holes, trenches, contact holes, raised features, lines, etc. As used herein, "topography" refers to the height or depth of a structure in or on the substrate surface.

A PAG immobilization composition (also referred to as "acid-generating composition") is applied to the surface 14 of substrate 12, or to the top intermediate layer (if any) on surface 14. The PAG immobilization composition can be applied by any known application method, with one preferred method being spin-coating the composition at speeds of from about 500 rpm to about 5000 rpm, and preferably from about 1,250 rpm to about 1,750 rpm, for a time period of from about 30 seconds to about 120 seconds, preferably from about 45 seconds to about 75 seconds, followed by baking. Preferred baking conditions comprise heating at temperatures from about 100° C. to about 300° C., and preferably from about 150° C. to about 250° C., for a time period of from about 30 seconds to about 300 seconds, and preferably from about 45 seconds to about 75 seconds, thus forming PAG immobilization layer (also referred to as "acid-generating layer") 16.

Optionally, a solvent puddle is performed on PAG immobilization layer 16 for a time period of from about 10 seconds to about 120 seconds, and preferably from about 20 seconds to about 60 seconds to remove any "loose" polymer residue. The solvent used for the puddle step is preferably a polar solvent, with PGMEA, PGME, cyclohexanone, dimethylacetamide, and/or tetrahydrofurfuryl alcohol being suitable examples of puddle solvents.

The substrate is then dried by spinning at speeds of from about 100 rpm to about 3,000 rpm, and preferably from about 1,250 rpm to about 1,750 rpm, for a time period of from about 30 seconds to about 120 seconds, and preferably from about 45 seconds to about 75 seconds. The PAG immobilization layer 16 is then preferably baked again. Preferred baking conditions preferably involve temperatures of from about 90° C. to about 200° C., and more preferably from about 100° C. to about 150° C., for a time period of from about 30 seconds to about 120 seconds, and preferably from about 45 seconds to about 75 seconds.

The average thickness of the PAG immobilization layer 16 after baking is preferably from about 1 nm to about 10 nm, more preferably from about 2 nm to about 5 nm, and even more preferably from about 3 nm to about 4 nm. Preferably, the PAG immobilization layer 16 is applied so that it conformally coats any topography (not shown) on the substrate 12. Regardless, it is preferred that PAG-containing polymers in the PAG immobilization layer 16 interact with the substrate surface 14 so as to adhere strongly to substrate surface 14. That interaction can be a chemical bonding between the components of the PAG immobilization layer 16 and/or intermolecular forces such as van der Waals forces and/or hydrogen bonding. The type of substrate 12 and components of the PAG immobilization composition are selected to facilitate these interactions.

In one embodiment, the PAG immobilization layer 16 can advantageously be selectively applied to the substrate 12. That is, the PAG immobilization layer 16 may selectively adhere to certain structures or materials on/in the substrate surface 14. For example, the PAG immobilization layer 16 may adhere to a titanium nitride or silicon nitride feature but not adhere to a trench of silicon oxide, or vice versa.

The cured or dried PAG immobilization layer 16 will be substantially insoluble in typical organic solvents such as EL, PGMEA, PGME, PnP, cyclohexanone, acetone, GBL, and mixtures thereof. Thus, when subjected to a stripping test, the cured PAG immobilization layer 16 will have a percent stripping of less than about 5%, preferably less than about 1%, and even more preferably about 0%. The stripping test involves first determining the thickness (by taking the average of measurements at five different locations) of the cured underlayer. This average is the initial average film thickness. Next, a solvent (e.g., ethyl lactate) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This average is the final average film thickness. The amount of stripping is the difference between the initial and final average film thicknesses, and the percent stripping is:

$$\% \text{ stripping} = \left(\frac{\text{amount of stripping}}{\text{initial average film thickness}}\right) \times 100.$$

A topcoat composition as described previously is applied to PAG immobilization layer 16. The topcoat composition can be applied by any known application method, with one preferred method being spin-coating the composition at speeds from about 500 rpm to about 3,000 rpm, and preferably from about 1,250 rpm to about 1,750 rpm, for a time period of from about 30 seconds to about 120 seconds, and preferably from about 45 seconds to about 75 seconds. In embodiments where the topcoat composition is a carbon-rich or hardmask composition, the spin speeds are preferably from about 1,000 to about 5,000 rpm, preferably from about 1,250 to about 1,750 rpm for the above time periods, followed by baking. Preferred baking conditions involve temperatures from about 90° C. to about 200° C., and more preferably from about 100° C. to about 150° C., for a time period of from about 30 seconds to about 120 seconds, and preferably from about 45 seconds to about 75 seconds, thus forming topcoat layer 18. As noted previously, topcoat layer 18 is acid-sensitive. The average thickness of the acid-sensitive topcoat layer 18 after baking is preferably from about 10 nm to about 1,000 nm, and more preferably from about 100 nm to about 500 nm.

Advantageously, no photoresist layer is necessary to photocure or photopattern the acid-sensitive topcoat layer 18. In other words, radiation exposure is preferably performed on topcoat layer 18 directly, without additional layers being formed between topcoat layer 18 formation and radiation exposure. Thus, the acid-sensitive topcoat layer 18 and PAG immobilization layer 16 are patterned by exposure to radiation for a dose of from about 1 mJ/cm$^2$ to about 500 mJ/cm$^2$, preferably from about 5 mJ/cm$^2$ to about 250 mJ/cm$^2$, and more preferably from about 10 mJ/cm$^2$ to about 50 mJ/cm$^2$. Preferred radiation wavelengths include EUV to near-IR wavelengths, including, but not limited to, about 13.5 nm, about 193 nm, about 248 nm, and about 365 nm. In more detail, the stack 10 is exposed using a mask 20 positioned above the topcoat layer 18. The mask 20 has open areas 20*a* designed to permit radiation to pass through the mask 20 and contact the acid-sensitive topcoat layer 18. The remaining portions 20*b* of the mask 20 are designed to prevent the radiation from contacting the surface of the acid-sensitive topcoat layer 18 in certain areas. Those skilled in the art will readily understand that the arrangement of open areas 20*a* and absorbing portions 20*b* is designed based upon the desired pattern to be formed in the acid-sensitive topcoat layer 18. Because topcoat layer 18 is formulated to have little to no absorbance at the target wavelength (i.e., less than about 10%, and preferably less than about 5% absorbance, at one of the above wavelengths and as determined by a VUV-VASE ellipsometer), the radiation will pass through topcoat layer 18 and contact PAG immobilization layer 16. Thus, the pattern will ultimately be formed in the PAG immobilization layer 16 for transfer to any intermediate layers and ultimately into the substrate 12, depending upon the user's goals. Additionally, in some embodiments, the topcoat layer 18 may be subjected to a blanket exposure rather than patterned using a mask 20.

After exposure, the topcoat layer 18 is preferably subjected to a post-exposure bake ("PEB") at a temperature of from about 90° C. to about 200° C., and preferably from about 150° C. to about 190° C. (depending on the composition from which topcoat layer 18 was formed), for a time period of from about 30 seconds to about 120 seconds, and preferably from about 45 seconds to about 75 seconds.

The areas of the PAG immobilization layer 16 that are exposed to the radiation will generate an acid, which diffuses into the acid-sensitive topcoat layer 18. During exposure and post-exposure bake, the acid that diffuses into the topcoat layer 18 will cause the polymer in topcoat layer 18 to crosslink in the areas exposed to the acid, or conversely, to deprotect and/or decrosslink in the areas exposed to the acid, depending on whether a positive tone or negative tone topcoat layer 18 was formulated, as described previously.

In one embodiment, a solvent puddle is performed for a time period of from about 30 seconds to about 120 seconds, and preferably from about 45 seconds to about 75 seconds, to remove any excess acid-sensitive topcoat layer 18. Preferred solvents for the puddle step include, but are not limited to, PGME, PGMEA, EL, cyclohexanone, methyl isobutyl ketone ("MIBK"), PnP, and mixtures thereof. The stack 10 is then dried by spinning at speeds preferably from about 1,000 rpm to about 3,000 rpm, more preferably from about 1,250 rpm to about 1,750 rpm, for a time period of from about 30 seconds to about 90 seconds, and preferably from about 45 seconds to about 75 seconds. The acid-sensitive topcoat layer 18 is then baked again. Preferred baking conditions involve temperatures of from about 90° C. to about 180° C., and more preferably from about 100° C. to about 150° C., for a time period of from about 30 seconds to about 90 seconds, and preferably from about 45 seconds to about 75 seconds.

After exposure, bake, and rinsing, the average thickness of the acid-sensitive topcoat layer is preferably from about 10 nm to about 1 mm, and more preferably from about 10 nm to about 500 nm, and even more preferably from about 100 nm to about 500 nm, depending on application needs.

Figure 1B:
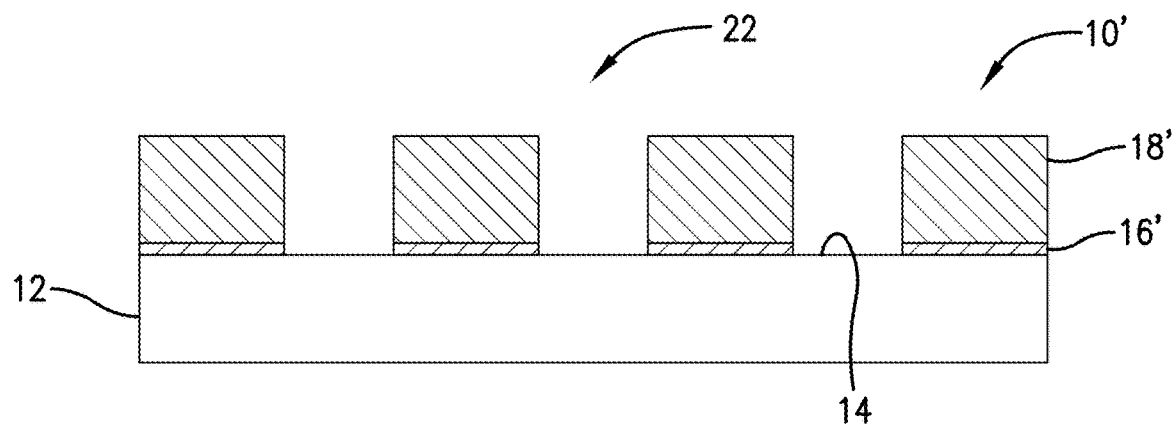
FIG. 1(B) is a schematic depiction of the pattern transfer steps carried out on the structure formed in FIG. 1(A)

The patterned topcoat layer 18 is then etched to form the desired pattern 22 (see FIG. 1(B)). Depending upon whether the topcoat layer 18 is positive-working or negative-working, the etching process will either remove the exposed portions of the topcoat layer 18, or remove the unexposed portions of the topcoat layer 18, to form the pattern 22. The pattern 22 is then transferred to the PAG immobilization layer 16, any present intermediate layers, and finally the substrate 12 (not shown). The etching of the topcoat layer 18, and the pattern transfer can take place via conventional plasma etching (e.g., $CF_4$ etchant, $O_2$ etchant) or conventional wet etching or developing processes.

It will be appreciated that the above process of forming the PAG immobilization layer 16 and topcoat layer 18 can be repeated to build multiple layers of the topcoat layer 18 in the stack 10. Advantageously, this can be used to create homogeneous and conformal coatings of a wide range of thicknesses. For a single PAG immobilization-topcoat cycle, conformal coatings with thicknesses of about 10 nm to about 350 nm can be obtained, while multiple PAG immobilization-topcoat cycles can produce conformal coatings of µm-thickness scale.

Figure 2A:
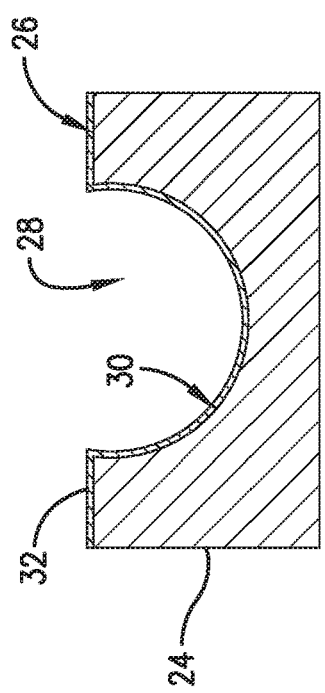
FIG. 2(A) is a schematic depiction of an alternative method of using the disclosed PAG-immobilization layers for trench shrinking.

In an alternative embodiment, the PAG immobilization layer can be used in spacer patterning and trench shrinking. Referring to FIG. 2, a trench shrinking process is schematically depicted. In FIG. 2(A), a substrate 24 having a surface 26 and a trench 28 formed in that surface 26 are shown. Trench 28 includes a curved surface 30, and although the trench 28 presents a circular cross-sectional shape in FIG. 2, it will be appreciated that the cross-sectional shape could be any desired shape (e.g., rectangular). Trench 28 has an initial diameter or width (i.e., maximum average distance between surfaces of the structure), where the initial diameter or width is that prior to the application of any compositions thereto.

A PAG immobilization composition as described previously is applied to the substrate surface 26 (following the process steps described previously) so as to form a very thin PAG immobilization layer 32 on the substrate surface 26 and on trench surface 30. PAG immobilization layer 32 is conformally coated on the topography created by substrate surface 26 and trench surface 30.

Figure 2B:
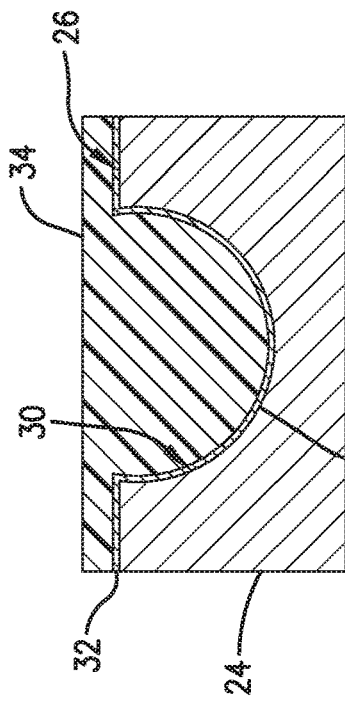
FIG. 2(B) schematically depicts trench filling of the FIG. 2(A) structure with a acid-sensitive topcoat composition.
Figure 2C:
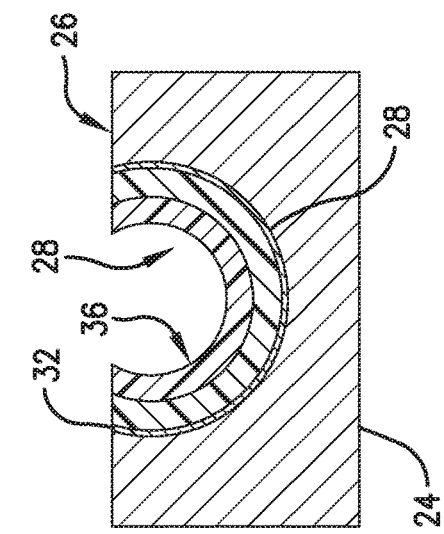
FIG. 2(C) schematically depicts the structure of FIG. 2(B) after surface coating removal.
Figure 2D:
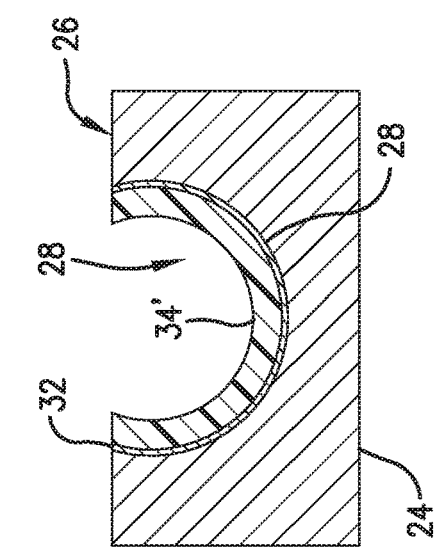
FIG. 2(D) shows the trench after exposure, bake, and develop.
Figure 2E:
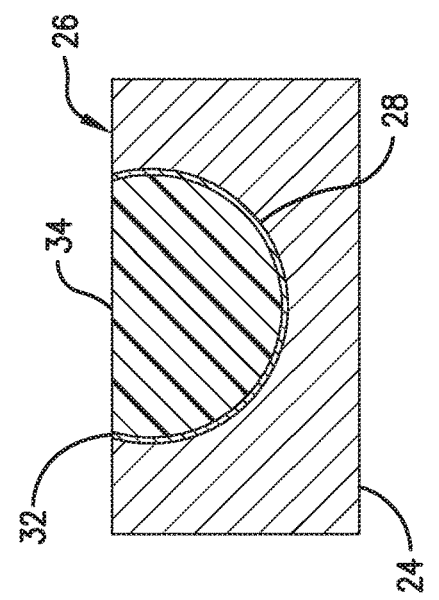
FIG. 2(E) depicts the structure of FIG. 2(D) after additionally layers have been formed to further shrink the trench.

Referring to FIG. 2(B), an acid-sensitive topcoat composition formulated as described previously is coated (following the process steps described previously) on PAG immobilization layer 32 to form topcoat layer 34. As shown in the figures, the topcoat composition fills the trench 28. Any of topcoat layer 34 outside of the trench 28 is removed, such as by chemical mechanical planarization (CMP) or plasma etching (FIG. 2(C)), leaving a substrate surface 26 that is substantially free of topcoat layer 34. Alternatively, selective application of the PAG immobilization composition described previously could be carried out in this instance. In other words, the PAG immobilization composition could be selectively applied so that it only contacts trench surface 30 and not substrate surface 26. In this instance, FIG. 2(B) could be skipped, as well as any steps between FIGS. 2(B) and 2(C), so that the process goes directly from FIG. 2(A) to the structure shown in FIG. 2(C).

The stack is then exposed and baked, as described previously. Because the PAG is conformally coated along the trench surface 30, only the acid-sensitive topcoat layer 34 that is in immediate contact with the PAG immobilization layer 32 will be crosslinked. Any uncrosslinked areas of the topcoat layer 34 can optionally be removed by developing (FIG. 2(D)). This process can be repeated to deposit more of the same or different acid-sensitive topcoat compositions to form sequential, crosslinked, conformal layers 36 (FIG. 2(E)), thus shrinking the size of trench 28. Although the foregoing was described in the context of a trench, it will be appreciated that the same gap shrinking concept could be applied to the space between raised features as well.

A further embodiment taking advantage of selective application of a PAG immobilized composition is depicted in FIG. 3. A substrate 38 having an upper surface 40 is provided (FIG. 3(A)). Substrate 38 comprises a pattern 42 on its surface 40, and that pattern 42 includes features 44. Features 44 can be formed by any conventional process and include respective sidewalls 46 and respective uppers surfaces 48. Following the previously described processes, a PAG immobilized composition has been selectively applied to sidewalls 46 (and possibly to upper surfaces 48 in small amounts) to form a thin layer of PAG immobilization layer 50 against those sidewalls 46. Importantly, PAG immobilization layer 50 does not adhere to substrate upper surface 40. The selective application can be accomplished in this and other contexts by creating areas or zones of increased affinity between that area or zone and the PAG immobilized composition. In this instance, the increased area of affinity is on the sidewalls 46. It will be appreciated that the opposite could also be the case. For example, areas or zones of decreased affinity could be created, such as at upper surfaces 48.

An acid-sensitive topcoat composition is then applied to the substrate surface 40, the sidewalls 46, and upper surfaces 48 following the previously described processes to form an acid-sensitive topcoat layer (not shown). The stack is then exposed and baked, as described previously. Because the PAG immobilization layer 50 is selectively coated only on the sidewalls 46, only the acid-sensitive topcoat layer that is in immediate contact with the PAG immobilization layer 50 will be crosslinked. Any uncrosslinked areas of the acid-sensitive topcoat layer can optionally be removed by developing, thus leaving crosslinked acid-sensitive layer 52 on PAG immobilization layer 50 (See FIG. 3(B)).

Figure 3A:
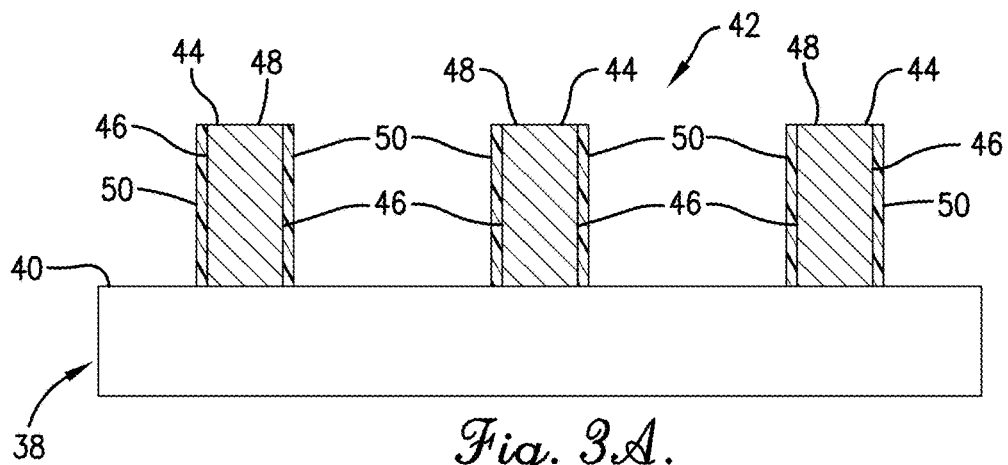
FIG. 3(A) is a schematic depiction of an alternative method of using the disclosed PAG-immobilization layers for spacer patterning.
Figure 3B:
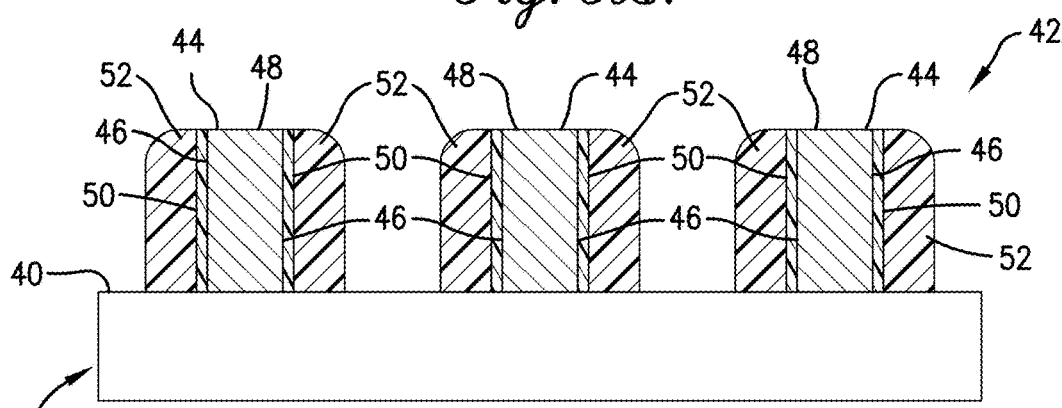
FIG. 3(B) is a schematic depiction of the sidewall coating of the structure formed in FIG. 3(A)
Figure 3C:
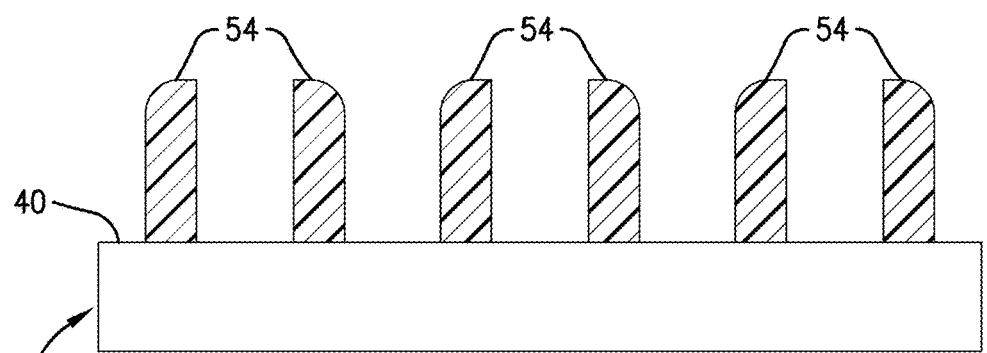
FIG. 3(C) is a schematic depiction of feature removal from the structure formed in FIG. 3(B)
Figure 3D:
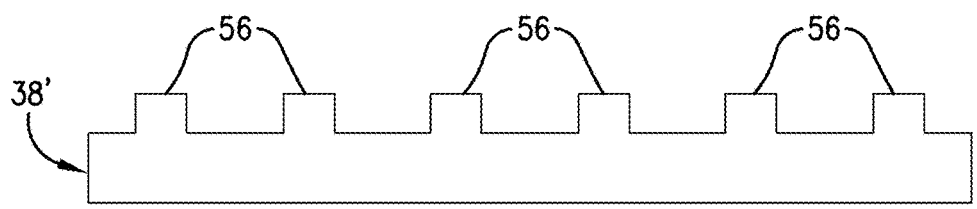
FIG. 3(D) is a schematic depiction of the lines or other structures formed in a substrate after transferring the pattern of the structure formed in FIG. 3(C)

Referring to FIG. 3(C), the features 44 can be removed via conventional processes (e.g., etching) to leave behind the structures 54. These structures 54 act as "spacers" for forming very small features (e.g., less than about 50 nm or even less than about 32 nm). That is, the structure is subjected to a conventional etching process that transfers the pattern created by structures 54 down to any intermediate layers present (not shown) and ultimately into substrate 38, forming lines (or other structure) 56 (see FIG. 3(D)).

The present invention results in a number of advantages. For example, a high density of PAGs can be packed onto surfaces, thus allowing high photosensitivity. Additionally, surface-bound PAGs mitigate anisotropic acid diffusion, which typically results in higher feature fidelity. Because only a very thin layer (or even a monolayer) of immobilized PAG can be utilized, the process described herein is not dependent on surface topography, allowing conformal coatings on curved/bent structures such as trench/via/hole walls. Additionally, structured created by this process may exhibit lower line edge roughness (LER) and line width roughness (LWR).

The range of patterning/coating polymers is also greatly expanded compared to that of a traditional photoresist. As long as the polymer can be crosslinked or decrosslinked/deprotected with acid catalysis, it can be used for photopatterning. This allows the topcoat composition to include materials such as silicon and/or metal hardmask precursors as described previously, enabling direct patterning of materials such as spin-on hardmasks. This also allows topcoats to be used that do not contain chromophores or other light-absorbing components. Finally, the process also eliminates the need for a traditional photoresist patterning step, and thus is attractive from a process complexity and cost standpoint.

Additional advantages of the various embodiments will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Monomer Synthesis: Polymerizable PAG 1 (TPS-SPMA)

A flask was charged with 11.9 grams (40.0 mmol) of triphenylsulfonium chloride ("TPS," Cambridge Chemicals, Woburn, Mass.), 14.8 grams (60 mmol) of 3-sulfopropyl methacrylate ("SPMA," Sigma-Aldrich, St. Louis, Mo.), 60 milliliters of chloroform (Sigma-Aldrich, St. Louis, Mo.), and 60 milliliters of deionized water. The mixture was refluxed for 4 days and then cooled, after which the organic layer was collected. The aqueous layer was washed (water, 3×100 ml) and dried (with $MgSO_4$), and the solvent was removed under reduced pressure to afford a pale yellow oil (12.4 grams, 66% yield). The reaction and workup were conducted in an environment that was free of ambient light.

Example 2

Monomer Synthesis: Polymerizable PAG 2 (Triphenylsulfonium 2,3,5,6-tetrafluoro-4-(methacryloyloxy)benzene Sulfonate)

Sodium 4-hydroxy-2,3,5,6-tetrafluorobenzene sulfonate was prepared according to the method of Gee et. al, Tetrahedron Letters 40 [1999], 1471-1474, incorporated by reference herein. Next, 30 grams (0.11 mol) of the sodium 4-hydroxy-2,3,5,6-tetrafluorobenzene sulfonate, 120 milliliters of trifluoroacetic acid (Sigma-Aldrich, St. Louis, Mo.), and 12.5 milliliters (0.15 mol) of methacrylic acid (Sigma-Aldrich, St. Louis, Mo.) were placed into a nitrogen-purged flask. The mixture was cooled in an icebath, and then 43 milliliters of trifluoroacetic anhydride (Acros-Organics, Fair Lawn, N.J.) was added. The mixture stirred for 16 hours over which time it warmed to room temperature. A few crystals of hydroquinone were added to the reaction mixture, and the volatiles were removed under reduced pressure at 40° C. Nest, 70 milliliters of heptane (Sigma-Aldrich, St. Louis, Mo.) were added to the resultant solid, which was subsequently collected by vacuum filtration, washed (heptane, 2×80 ml), and then dried under vacuum to yield sodium 2,3,5,6-tetrafluoro-4-(methacryloyloxy)benzene sulfonate as a white powder (30.5 grams, 82% yield).

A flask was charged with the 30.5 grams (0.09 mmol) of the sodium 2,3,5,6-tetrafluoro-4-(methacryloyloxy)benzene sulfonate prepared in the Example, 26.5 grams (0.08 mol) of triphenylsulfonium bromide (TCI America, Portland, Oreg.), 200 milliliters of deionized water, and 200 milliliters of dichloromethane (Sigma-Aldrich, St. Louis, Mo.). The reaction mixture was stirred at room temperature over the weekend, after which the organic layer collected. The aqueous layer was washed with water (100 ml), then ammonium hydroxide solution (100 ml), and then water (100 ml). The organic solution was dried in $MgSO_4$, and a few crystals of hydroquinone were added and the solvent removed under reduced pressure to yield the triphenylsulfonium 2,3,5,6-tetrafluoro-4-(methacryloyloxy)benzene sulfonate as a pale yellow liquid (52 grams, quantitative). The monomer was immediately dissolved in polymerization solvents (e.g. DMF, PGME, DMAc) and stored at 4° C. for future use. The reaction and workup were conducted in an environment that was free of ambient light.

Example 3

Synthesis of Surface-Immobilizable PAG Polymer 1

Synthesis was performed in a yellow laboratory where UV light was removed. In a 100 mL 2 neck round bottom flask equipped with water condenser and $N_2$ purging, 5.2 grams of triphenylsulfonium 3-sulfopropyl methacrylate (synthesized in Example 1), 1.3 grams of 2-hydroxyethyl methacrylate (HEMA, Sigma Aldrich, St. Louis, Mo.), 6.1 grams of styrene (Sigma Aldrich, St. Louis, Mo.), 0.58 gram of Vazo 67 initiator (DuPont, Wilmington, Del.), and 25.9 grams of cyclohexanone (Sigma Aldrich, St. Louis, Mo.) were added and stirred for 30 minutes at room temperature under $N_2$ purging. The flask was then immersed in 90° C. oil bath to start polymerization. Polymerization proceeded for 16 hours to finish. The polymer mother liquor was cooled to room temperature and stored in amber bottle for future formulations.

Example 4

Synthesis of Surface-Immobilizable PAG Polymer 2

Synthesis was performed in a yellow laboratory where UV light was removed. In a 100 mL 2 neck round bottom flask equipped with water condenser and $N_2$ purging, 4.0 grams of triphenylsulfonium 2,3,5,6-tetrafluoro-4-(methacryloyloxy)benzene sulfonate (synthesized in Example 2), 1.0 gram of 2-hydroxyethyl methacrylate (HEMA), 5.0 grams of styrene, 0.5 gram of Vazo 67 initiator, and 30.0 grams of PGME (FUJIFILM Ultra Pure Solutions, Inc., Castroville, Calif.) were added and stirred for 30 minutes at room temperature under $N_2$ purging. The flask was then immersed in 90° C. oil bath to start polymerization. Polymerization proceeded for 16 hours to finish. The polymer mother liquor was cooled to room temperature and stored in an amber bottle for future formulations.

Example 5

Synthesis of Topcoat Polymer 1A

In this procedure, 25.0 grams of styrene (TCI America, Portland, Oreg.), 25.0 grams of HEMA (Sigma Aldrich, St. Louis, Mo.), 1.0 gram of AIBN (Sigma Aldrich, St. Louis, Mo.), and 119.0 grams of PGME (FUJIFILM Ultra Pure Solutions, Inc., Castroville, Calif.) were mixed, and $N_2$ purged for 30 minutes in a 250-ml 3-neck round bottom flask equipped with water condenser before immersing to an oil bath of 65° C. Polymerization proceeded at 65° C. for 16 hours under $N_2$ purging and stirring. The product was then cooled to room temperature and bottled for future formulations.

Example 6

Surface PAG Immobilization and PAG Activity Test

The PAG polymers formulated in Examples 3 and 4 were formulated into 1% solids solutions in PGME and were spin-coated onto 100-mm silicon wafers at 1,500 rpm for 60 seconds and baked at 205° C. on a hotplate for 60 seconds. The wafers were then washed using a 30-second PGME puddling, and then were baked again at 130° C. for 60 seconds, resulting in ~3 nm immobilized PAG ultrathin films.

Figure 4:
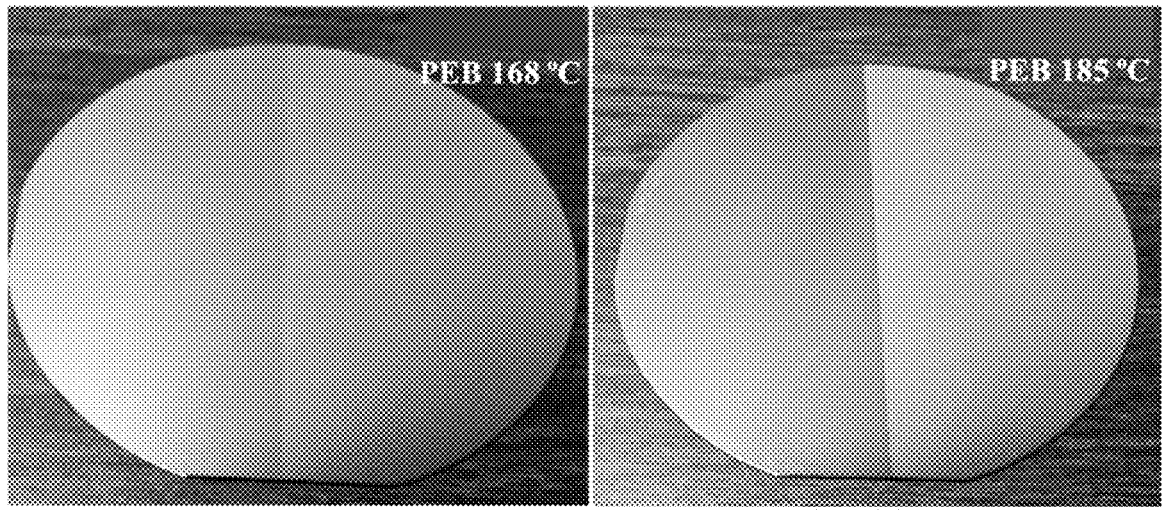
FIG. 4 provides photoimages of the exposed (left) and unexposed (right) wafers as described in Example 6.

The top coat copolymer synthesized in Example 5 (diluted to 4% solids in PGME) was then spin-coated at 1,500 rpm for 60 seconds and baked at 130° C. on a hotplate for 60 seconds, giving a ~530-nm coating. The wafers were then half opaque blocked, half exposed for a dose of 200 mJ/cm$^2$ (Hg—Xe light source, broadband), and post-exposure baked (PEB) on a hotplate at different temperatures for 60 seconds, followed by a 30-second PGME puddle and soft bake (130° C. for 60 seconds). The coating thickness on each half was measured by ellipsometry. The results are shown in Table 1, which show that the immobilized PAGs are photoactive, as proved by the coating thickness differences between exposed and unexposed areas. The results also substantiated that the resulted coatings are formed from bottom-up (can be much thinner than coated film) and conformal (thickness deviation can be less 1%). Coating thickness varies with PAG type (the PAG polymer from Example 4 generates more acid than the PAG polymer from Example 3) and PEB. FIG. 4 shows images of the exposed (left) and unexposed (right) wafers from this Example.

TABLE 1

Exposed and Unexposed Thickness of Polymer Layer After Exposure and Rinse.

| PAG polymer | PAG thickness (nm) | Top coat thickness (nm) | PEB (° C.) | Exposed thickness (nm) | Unexposed thickness (nm) |
|---|---|---|---|---|---|
| Example 3 | 5 nm | 358 | 150 | 20 ± 1 | 5 |
|  |  |  | 168 | 21 ± 1 | 6 |
|  |  |  | 185 | 28 ± 1 | 7 |
| Example 4 | 3 nm | 356 | 150 | 116 ± 4 | 7 |
|  |  |  | 168 | 236 ± 3 | 8 |
|  |  |  | 185 | 325 ± 2 | 10 |

Example 7

Conformal Coating on Ramco-6 Trench Structure

Figure 5:
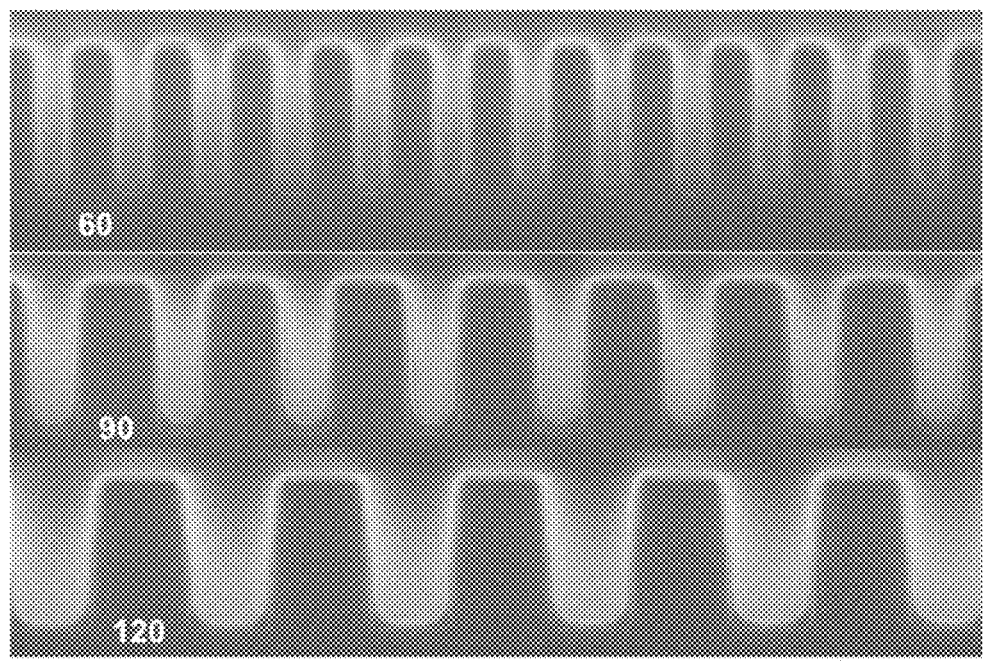
FIG. 5 is a scanning electron microscope (SEM) photograph showing conformal, thin coatings on trenches (size in nm) in substrates as described in Example 7.

A Ramco-6 trench substrate was cut to 2-cm×2-cm chips. The chips were washed with PGME and baked dry on a hotplate at 130° C. for 60 seconds before using. Next, 1% PAG polymer as made in Example 3 in PGME was spin-coated at 1,500 rpm for 60 seconds, baked on a hotplate at 205° C. for 60 seconds, washed using a 30-second PGME puddling, and baked again on a hotplate at 130° C. for 60 seconds. A top coat copolymer of styrene and hydroxymethyl methacrylate in (4% solids in PGME) was then spin-coated at 1,500 rpm for 60 seconds and baked at 130° C. on a hotplate for 60 seconds. The chips were then exposed for a dose of 200 mJ/cm$^2$ (Hg—Xe light source, broadband), and post-exposure baked (PEB) on a hotplate at different temperatures for 60 seconds, followed by two rounds of 30-second PGME puddle and soft bake (130° C. for 60 seconds). FIG. 5 shows cross-section SEM images of 60 nm, 90 nm, and 120 nm dense trenches after processing. A thin layer of polymer coating (~12 nm thick) conformably and continuously covered the trenches over their entireties.

Example 8

Direct Photopatterning of Spin-on Carbon (SOC)

In this Example, a 1% PAG polymer as synthesized in Example 4 in PGME was spin-coated on a 100-mm silicon wafer at 1,500 rpm for 60 seconds, baked on a hotplate at 205° C. for 60 seconds, washed using a 30-second PGME puddling, and baked again on a hotplate at 130° C. for 60 seconds. Then, on the PAG immobilized wafer, a top coat copolymer of styrene and hydroxymethyl methacrylate in (4% solids in PGME) was then spin-coated at 1,500 rpm for 60 seconds and baked at 130° C. on a hotplate for 60 seconds. A chrome patterned contact photo mask (Brewer Science, Rolla, Mo.) was placed on top of the wafer. The wafer was then exposed (broadband Hg—Xe light source) at 200 mJ/cm$^2$, baked on a hotplate at 185° C. for 60 seconds, followed by a 30-second PGME puddle and soft bake at 130° C. for 60 seconds. The photopatterned SOC coating was evaluated by optical microscope and Dektak 8 profilometer.

Figure 6:
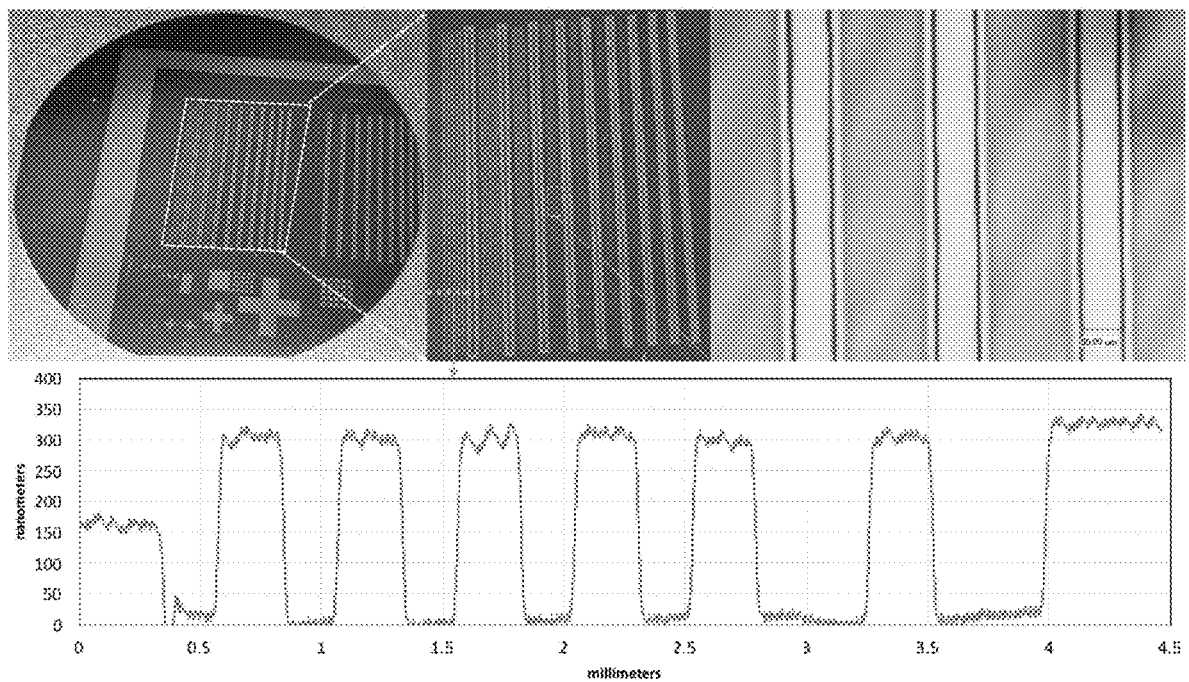
FIG. 6 provides a photo image and optical microscope images (scale shown in images) and profilometer results of direct photopatterning spin-on-carbon as described in Example 8.

Results are shown in FIG. 6, where the top left is the picture of the photo patterned wafer, the top middle is the enlarged part of the wafer (parallelogram marked), and the top right is an optical microscope image of the line/trench pattern (rectangle marked in top middle). The plot in the bottom shows the scan profile across the line/trench as marked in the top middle (thick dash) as measured by a Dektak 8 profilometer (Veeco Instruments Inc.)

Example 9

Layer-by-Layer Conformal Coating

In this Example, 1% solids of the PAG polymer formulated in Example 4 in PGME was spin coated on a 100-mm silicon wafer at 1,500 rpm for 60 seconds, baked on a hotplate at 205° C. for 60 seconds, washed using a 30-second PGME puddling, and baked again on a hotplate at 130° C. for 60 seconds, thus forming a PAG immobilized wafer. Next, a topcoat copolymer of styrene and hydroxymethyl methacrylate in (4% solids in PGME) was then spin-coated onto that PAG immobilized wafer at 1,500 rpm for 60 seconds and baked at 130° C. on a hotplate for 60 seconds, and the thickness was recorded using ellipsometry. The wafer was then exposed at 200 mJ/cm² (Hg—Xe light source, broadband), post-exposure baked on a hotplate at 185° C. for 60 seconds, developed with PGME for 30 seconds, soft baked on a hotplate at 130° C. for 60 seconds, and the thickness was recorded again using ellipsometry. The PAG immobilization-top coat cycle was repeated to get a multilayer bottom-up conformal coating. Table 2 lists the results of 4 cycles. The results show that each layer had very similar thickness of 305 to 320 nm.

TABLE 2

Immobilized PAG-SOC Layer-by-Layer Conformal Coating on Si Wafer.

| | 1st layer | 2nd layer | 3rd layer | 4th layer |
|---|---|---|---|---|
| Thickness before exposure (nm) | 351 ± 3 | 686 ± 5 | 1043 ± 10 | 1392 ± 17 |
| Thickness after exposure (nm) | 305 ± 4 | 628 ± 7 | 948 ± 12 | 1269 ± 18 |

Example 10

Layer-by-Layer Conformal Coating

Figure 7:
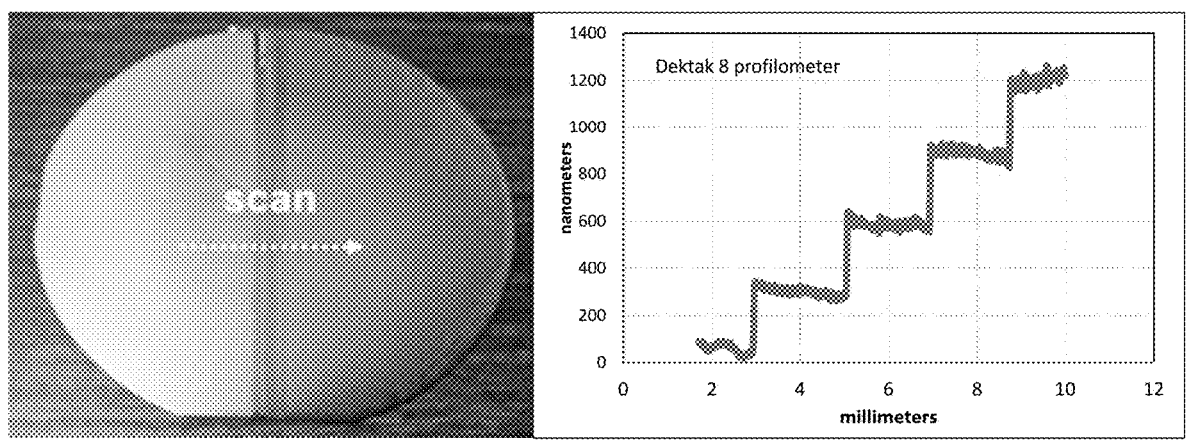
FIG. 7 provides a photograph of four layers of a bottom-up conformal coating and the profilometer results (Example 10).

In this example, the PAG immobilization-top coat cycle was repeated as in Example 8 to get a multilayer bottom-up conformal coating. However, for the 2nd, 3rd, and 4th cycles, an opaque blocker was moved away from the edge of the prior exposed layer about 2 millimeters. A picture of finished 4 layers of a bottom up conformal coating is shown in FIG. 7 (left). A Dektak 8 diagram obtained by scanning across the boundaries of each layer is shown in FIG. 7 (right). Referring to the graph on the right, the 4 stairs of 300-nm height correspond to the 4 layers of conformal bottom-up coating. The slight difference of thickness arises from precision difference between ellipsometry and the stylus profiler.

We claim:

1. A method of forming a structure, said method comprising:
    applying an acid-generating composition on a substrate surface, or on one or more intermediate layers optionally present on said substrate surface, said acid-generating composition comprising a polymer including recurring monomers comprising an acid-generating group;
    heating said acid-generating composition to form an acid-generating layer having an average thickness of between 2 nm and 5 nm;
    applying an acid-sensitive composition on said acid-generating layer, said acid-sensitive composition comprising less than about 0.5% by weight total of acids, photoacid generators, and thermal acid generators, based upon the total weight of the composition taken as 100% by weight;
    heating said acid-sensitive composition to form an acid-sensitive layer; and
    exposing at least a portion of said acid-sensitive layer to radiation.

2. The method of claim 1, said polymer further comprising recurring monomers comprising a surface adhesion group.

3. The method of claim 2, wherein said surface adhesion group is selected from the group consisting of hydroxys, epoxies, carboxylic acids, thiols, silanes, aldehydes, acetylacetonates, and combinations of the foregoing.

4. The method of claim 2, wherein said recurring monomers comprising the surface adhesion group are selected from the group consisting of 2-hydroxyethyl methacrylate, hydroxypropyl methacrylate, glycidyl methacrylate, methacrylic acid, acrylic acid, mono-2-(methacryloyloxy)ethyl succinate, 2-(methylthio)ethyl methacrylate, 3-(trimethoxy silyl)propyl methacrylate, 3-[(4-ethenylphenyl)methoxy]-benzaldehyde, 2-(methacryloyloxy)ethyl acetoacetate, and combinations of the foregoing.

5. The method of claim 1, wherein said acid-generating group is selected from the group consisting of onium salts, substituted forms of onium salts, triazines, and combinations thereof.

6. The method of claim 1, wherein said acid-generating group is selected from the group consisting of triphenyl sulfonium perfluorosulfonates, alkyl-substituted triphenyl sulfonium perfluorosulfonates nonaflates, tris(4-tert-butylphenyl)sulfonium perfluoro-1-butanesulfonate, N-hydroxynaphthalimide triflate, N-hydroxy-5-norbornene-2,3-dicarboximide perfluoro-1-butanesulfonate), 2-methyl-2-(2'-furylethylidene)-4,6-bis(trichloromethyl)-1,3,5-triazine, 24(4'-methoxy)styryl]-4,6-bis(trichloromethyl)-1,3,5-triazine, and combinations thereof.

7. The method of claim 1, wherein said acid-generating group is bonded to a monomer selected from the group consisting of acrylates, acrylamides, acrylonitriles, esters, amides, aromatic amines and diamines, dianhydrides, and combinations thereof.

8. The method of claim 1, wherein said recurring monomers comprising an acid-generating group include at least one of triphenylsulfonium 3-sulfopropyl methacrylate or triphenyl sulfonium 4-(methacryloxy)-2,3,5,6-tetrafluoro benzenesulfonate.

9. The method of claim 8, wherein said polymer further comprises recurring monomers of at least one of hydroxyethylmethacrylate and styrene.

10. The method of claim 1, said polymer further comprising recurring monomers comprising a solubility enhancing monomer selected from the group consisting of styrene, methyl methacrylate, methylstyrene, 4-tert-butylstyrene, n-butyl methacrylate, benzyl methacrylate, and combinations thereof.

11. The method of claim 1, wherein said acid-generating composition comprises from about 0.5% to about 5% by weight of said polymer and about 95% to about 99.5% by weight of one or more solvents.

12. The method of claim 1, said acid-sensitive composition further comprising a polymer chosen from:
    a polymer that crosslinks upon exposure to an acid so that the portion exposed to radiation becomes insoluble in photoresist developers;
    (ii) a polymer comprising recurring monomers having a protecting group that is removable upon exposure to an acid so as to change the solubility of the portion exposed to radiation; and
    (iii) a polymer that crosslinks upon exposure to heat and that decrosslinks upon exposure to an acid.

13. The method of claim 1, wherein said acid-sensitive layer is chosen from:
    a layer comprising from about 50% to about 90% by weight carbon, based on the total solids in the layer taken as 100% by weight; or
    a layer comprising from about 10% to about 50% by weight silicon, based on the total solids in the layer taken as 100% by weight.

14. The method of claim 1, wherein said substrate surface is on a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

15. The method of claim 1, further comprising, after said exposing, selectively removing portions of said acid-sensitive layer to form a pattern.

16. The method of claim 15, further comprising transferring said pattern into said one or more intermediate layers, if present, and into said substrate surface.

17. The method of claim 1, wherein said substrate surface comprises topography formed therein.

18. The method of claim 1, wherein:
said substrate surface includes at least one of:
a trench having sidewalls, there being an initial trench width between said sidewalls; and
raised features having respective sidewalls that are spaced an initial width apart; and
said applying an acid-generating composition comprises applying said acid-generating composition on said trench sidewalls, said raised feature sidewalls, or both said trench sidewalls and said raised feature sidewalls, said method further comprising removing at least some of said acid-sensitive layer so as to create one or both of the following:
a second width between trench sidewalls that is smaller than said initial trench width; and
a second width between said sidewalls that is smaller than said initial width between said respective sidewalls.

19. The method of claim 1, wherein said acid-generating composition is selectively applied to areas on said substrate surface.

20. The method of claim 19, wherein said selectively applied is accomplished by including one or both of the following on said substrate surface:
one or more areas to which said acid-generating composition has an affinity; and
one or more areas to which said acid-generating composition lacks an affinity.

21. The method of claim 20, wherein said substrate surface includes raised features having respective sidewalls and said one or more areas to which said acid-generating composition has an affinity are on said respective sidewalls, wherein said applying said acid-generating composition comprises applying said acid-generating composition to said sidewalls, and further comprising removing at least some of said raised features to leave spacers formed of said acid-generating composition.

22. The method of claim 21, wherein said spacers are used as a pattern that is transferred to said one or more intermediate layers, if present, and to said substrate surface.

23. A microelectronic structure comprising:
a substrate having a surface;
one or more optional intermediate layers on said substrate surface;
an acid-generating layer on said one or more optional intermediate layers, if present, or on said substrate surface, if no intermediate layers are present, said acid-generating layer having an average thickness of between 2 nm and 5 nm and comprising a polymer including recurring monomers comprising an acid-generating group; and
an acid-sensitive layer on said acid-generating layer, said acid-sensitive layer comprising less than about 0.5% by weight total of acids, photoacid generators, and thermal acid generators, based upon the total weight of the acid-sensitive layer taken as 100% by weight.

24. The structure of claim 23, said polymer further comprising recurring monomers comprising a surface adhesion group selected from the group consisting of hydroxyls, epoxies, carboxylic acids, thiols, silanes, aldehydes, acetylacetonates, and combinations of the foregoing.

25. The structure of claim 23, wherein said acid-generating group is selected from the group consisting of onium salts, substituted forms of onium salts, triazines, and combinations thereof.

26. The structure of claim 23, wherein said acid-generating group is bonded to a monomer selected from the group consisting of acrylates, acrylamides, acrylonitriles, esters, amides, aromatic amines and diamines, dianhydrides, and combinations thereof.

27. The structure of claim 23, said acid-sensitive layer further comprising a polymer chosen from:
a polymer that crosslinks upon exposure to an acid so that a portion exposed to radiation become insoluble in photoresist developers;
(ii) a polymer comprising recurring monomers having a protecting group that is removable upon exposure to an acid so as to change the solubility of a portion exposed to radiation; and
(iii) a polymer that crosslinks upon exposure to heat and that decrosslinks upon exposure to an acid.

28. The structure of claim 23, wherein said acid-sensitive layer is chosen from:
a layer comprising from about 50% to about 90% by weight carbon, based on the total solids in the layer taken as 100% by weight; or
a layer comprising from about 10% to about 50% by weight silicon, based on the total solids in the layer taken as 100% by weight.

29. The structure of claim 23, wherein said substrate comprises a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

30. The structure of claim 23, wherein:
said substrate surface includes at least one of:
a trench having sidewalls; and
raised features having respective sidewalls; and
said acid-generating layer is on said trench sidewalls, said raised feature sidewalls, or both said trench sidewalls and said raised feature sidewalls.

31. The structure of claim 23, wherein said substrate surface comprises one or both of the following:
one or more areas to which said acid-generating layer has an affinity; and
one or more areas to which said acid-generating layer lacks an affinity, wherein:
said substrate surface includes raised features having respective sidewalls and said one or more areas to which said acid-generating layer has an affinity are on said respective sidewalls; and
said acid-generating layer is on said one or more areas to which said acid-generating layer has an affinity.

32. A microelectronic structure comprising:
a substrate having a surface;
one or more optional intermediate layers on said substrate surface;
an acid-generating layer on said one or more optional intermediate layers, if present, or on said substrate surface, if no intermediate layers are present, said acid-generating layer having an average thickness of between 2 nm and 5 nm and comprising:

unexposed portions that comprise a first polymer including recurring monomers comprising an acid-generating group; and exposed portions that comprise a second polymer and an acid; and an acid-sensitive layer on said acid-generating layer, said acid-sensitive layer comprises:

unexposed portions that comprise less than about 0.5% by weight total of acids, photoacid generators, and thermal acid generators, based upon the total weight of the unexposed portions taken as 100% by weight, and that have a first solubility in a photoresist developer and/or a photoresist solvent; and exposed portions that have a second solubility in the same photoresist developer and/or photoresist solvent, said second solubility being different than said first solubility of said unexposed portions.

33. The structure of claim 32, said first polymer further comprising recurring monomers comprising a surface adhesion group selected from the group consisting of hydroxys, epoxies, carboxylic acids, thiols, silanes, aldehydes, acetylacetonates, and combinations of the foregoing.

34. The structure of claim 32, wherein said acid-generating group is:

selected from the group consisting of onium salts, substituted forms of onium salts, triazines, and combinations thereof; and bonded to a monomer selected from the group consisting of acrylates, acrylamides, acrylonitriles, esters, amides, aromatic amines and diamines, dianhydrides, and combinations thereof.

35. The structure of claim 32, the unexposed portions of said acid-sensitive layer comprise a polymer chosen from:

a polymer that crosslinks upon exposure to an acid so that a portion exposed to radiation becomes insoluble in photoresist developers;

(ii) a polymer comprising recurring monomers having a protecting group that is removable upon exposure to an acid so as to change the solubility of a portion exposed to radiation; and (iii) a polymer that crosslinks upon exposure to heat and that decrosslinks upon exposure to an acid.

36. The structure of claim 32, wherein said acid-sensitive layer is chosen from:

a layer comprising from about 50% to about 90% by weight carbon, based on the total solids in the layer taken as 100% by weight; or a layer comprising from about 10% to about 50% by weight silicon, based on the total solids in the layer taken as 100% by weight.

37. The structure of claim 32, wherein said substrate surface is on a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

38. The structure of claim 32, wherein:

said substrate surface includes at least one of:
a trench having sidewalls; and
raised features having respective sidewalls; and said acid-generating layer is on said trench sidewalls, said raised feature sidewalls, or both said trench sidewalls and said raised feature sidewalls.

39. The structure of claim 32, wherein said substrate surface comprises one or both of the following:

one or more areas to which said acid-generating layer has an affinity; and one or more areas to which said acid-generating layer lacks an affinity, wherein:

said substrate surface includes raised features having respective sidewalls and said one or more areas to which said acid-generating layer has an affinity are on said respective sidewalls; and said acid-generating layer is on said one or more areas to which said acid-generating layer has an affinity.

* * * * *